United States Patent [19]

Cushing et al.

[11] Patent Number: 5,003,204
[45] Date of Patent: Mar. 26, 1991

[54] EDGE TRIGGERED D-TYPE FLIP-FLOP SCAN LATCH CELL WITH RECIRCULATION CAPABILITY

[75] Inventors: David E. Cushing, Chelmsford; John A. DeFalco, Marlboro, both of Mass.

[73] Assignee: Bull HN Information Systems Inc., Billerica, Mass.

[21] Appl. No.: 452,883

[22] Filed: Dec. 19, 1989

[51] Int. Cl.$^5$ .......................................... H03K 19/177
[52] U.S. Cl. .................. 307/465; 307/272.2; 307/276; 307/469; 307/481; 371/22.3
[58] Field of Search .......................... 307/451–452, 307/465, 468, 469, 481, 272.2, 276, 243, 303.1, 303.2; 357/45; 371/22.3

[56] References Cited

U.S. PATENT DOCUMENTS

| | | | |
|---|---|---|---|
| 3,582,902 | 6/1971 | Hirtle et al. | 340/172.5 |
| 4,399,377 | 8/1983 | Jones | 307/465 |
| 4,540,903 | 9/1985 | Cooke et al. | 307/276 X |
| 4,554,466 | 11/1985 | Dillon | 307/272.2 |
| 4,554,664 | 11/1985 | Schultz | 371/22.3 |
| 4,575,674 | 3/1986 | Bass et al. | 324/73 R |
| 4,581,739 | 4/1986 | McMahon, Jr. | 371/22.3 |
| 4,649,539 | 3/1987 | Crain et al. | 371/25 |
| 4,689,654 | 8/1987 | Brockmann | 357/45 |
| 4,692,633 | 9/1987 | Ngai et al. | 371/22.3 |
| 4,851,717 | 7/1989 | Yale | 357/45 X |
| 4,864,161 | 9/1989 | Norman et al. | 307/272.2 |
| 4,870,300 | 9/1989 | Nakaya et al. | 357/45 X |
| 4,933,576 | 6/1990 | Tamamura et al. | 307/465 |

OTHER PUBLICATIONS

Stolte et al., "Design for Testability of the IBM System/38", *Digest of Papers*, 1979 Test Conf., pp. 29-36 (371/22.3).

Moser, Jr., "LSSD Scan Path Truncated to Minimum Length for Testing", *IBM T.D.B.*, vol. 25, No. 12, May 1983, pp. 6547-6549 (371/22.3).

Gate Array Training Class, Classnotes LDSIII VM/CMS Version, LSI Logic Corporation, 5/86, pp. 1-32; 2-8; 2-14 & 2-26.

"Designer" Logic and Symbols with Logic Cell Arrays, by Steve L. Lanry, Xilinx, Inc., IEEE Micro, 2/87, pp. 51-59.

*Primary Examiner*—David Hudspeth
*Attorney, Agent, or Firm*—Faith F. Driscoll; John S. Solakian

[57] ABSTRACT

A synchronous latch device macrocell which includes an input gate section and a scannable latch section. Both sections are directly connected together to provide a non-inverting path for input data signals thereby eliminating the need for internal inverting buffer circuits. The non-inverting output of the latch section connects to an output pin and provides a signal representation of the state of the latch device. The output pin is externally connected through a conductor wire to either one of a pair of complementary data input pins of the input gate section. The connection made is selected as a function of which data input pin connection provides the faster loading of the latch device as viewed from the source of the signal applied to the load control pin of the input gate section.

31 Claims, 7 Drawing Sheets

EDGE TRIGGERED D-TYPE FLIP-FLOP SCAN LATCH CELL WITH RECIRCULATION CAPABILITY

BACKGROUND OF THE INVENTION

1. Field of Use

The present invention relates to macrocells and more particularly to flip-flop cells with a scan capability.

2. Prior Art

A well known technique for implementing very large scale integration (VLSI) microprocessor chips is through the use of macro or library cells. The logic designer combines macro cells included in the library corresponding to types of restricted function building blocks (e.g. inverters, flip-flops, selectors) by specifying interconnections between cell inputs and outputs. The patterns of interconnections are included in an interconnection layer of the VLSI microprocessor chip.

In general, the cell/gate array manufacturers specify a set of design rules which must be followed precisely in making such interconnections. One such rule is that there can be no gated clock signals used with synchronous flip-flops. This becomes a problem in implementing those designs which have registers which are loaded only on selected conditions. That is, the register contents do not change on every clock or on every cycle or on every instruction.

Characteristically, LSI chips often or sometimes include some type of diagnostic serial scan capability used in testing and verifying proper system operation. An example of this type of capability is described in U.S Pat. Nos. 3,582,902 and 4,649,539.

In order to implement such a capability using predefined cells, it becomes necessary to interconnect two or more such cells together. For example, it has been proposed to connect a scannable D flip-flop and an input multiplexer cell with another input multiplexer cell positioned before the input multiplexer to accommodate the scan requirement. Also, it has been proposed to interconnect separate inverter, AND/OR and D flip-flop cells together. Alternatively, the scan requirement has been implemented by utilizing a special diagnostic circuit included within a major cell such as in the arrangement described in U.S. Pat. No. 4,575,674.

The above arrangements require additional cells or space for additional interconnects which not only reduce chip area but because of longer signal propagation times, circuit speed is reduced thereby adversely affecting system performance. Additionally, the use of different cells can provide different speeds which vary as a function of the physical locations of the cells within the array. This can lead to less predictable operation and difficulties in processing system conditions.

Accordingly, it is a primary object of the present invention to provide a device which complies with the restrictions imposed by IC manufacturers.

It is further object of the present invention to provide a device which is capable of performing a wide variety of functions but without requiring an increase in area when implemented in an macrocell array.

It is still a further object of the invention to provide a device which requires a minimum signal propagation delay.

SUMMARY OF THE INVENTION

The above objects and advantages are achieved in a preferred embodiment of the present invention by a synchronous latch device which is implemented in the form of a single macrocell of a macrocell array. For the purposes of the invention, a macrocell is an extension of the gate array in which macro functions used to define logic simulations are directly implemented within the basic cell structure rather than formed by interconnecting several logic gate cells of a gate array.

According to the preferred embodiment of the present invention, the synchronous latch device includes an input gate section and a scannable latch section. The input gate section directly connects internally to the data input terminal of the latch section to provide a non-inverting path for input data signals. The non-inverting output terminal of the latch section is connected to an output pin to provide a signal representative of the state of the latch for use as a recirculation or hold input to the latch section.

The input gate section is constructed from a standard multiplexer part and has a minimum of input pins. These are first and second complementary controlled data input pins and a load control input pin. The load control input pin is normally connected to a qualifier signal or to other logic circuits within the system for processing several logic conditions which are enabled by such qualifier signal.

According to the present invention, either the first or second data input pins can be interconnected to the latch output pin for holding the latch in the same state to allow for either negative or positive logic. That is, the load control or hold function can be controlled by the load control pin with either negative or positive logic whichever connection is required for attaining maximum speed or for minimizing space requirements.

In operation, the latch device can be conditioned to store new data or remain in its current state as a function of the state of the single input signal applied to its load control input pin in response to positive going edges of the clocking signals applied to a chip clock input of the latch device.

In the preferred embodiment, use of a qualifier signal as part or all of the load control signal generation function simplifies the way of handling a variety of control logic functions which require the selective loading of register devices under certain conditions while still meeting design rule requirements of having no gated clock control signals. The arrangement of having two data input pins available for new data permits the use of the faster hold signal as the data input thereby minimizing switching time.

During scan operations, no clocking signals are applied to the chip clock input of the latch device thereby effectively disconnecting the input section from the latch section. When so disconnected, clocking signals are applied to the scan input clock pins of the latch device for loading the data signals applied to a scan data input pin of the latch section of the device. Clearing is accomplished by forcing the scan data input pin to an inactive or binary ZERO state. The latch device of the present invention makes use of standard macrocells to the extent possible thereby eliminating the need for additional layers of metalization. The latch device of the preferred embodiment requires an area which is not that much larger than the standard scannable D flip-flop macrocell, a part of which it incorporates.

From the above, it is seen how the latch device of the present invention reduces the complexity and enhances the speed at which a variety of different logical functions may be performed. These and other objects and advantages of the present invention will be better understood from the following detailed description when taken in connection with the accompanying drawings.

DETAILED DESCRIPTION OF THE PREFERRED EMBODIMENT

Figure 1:
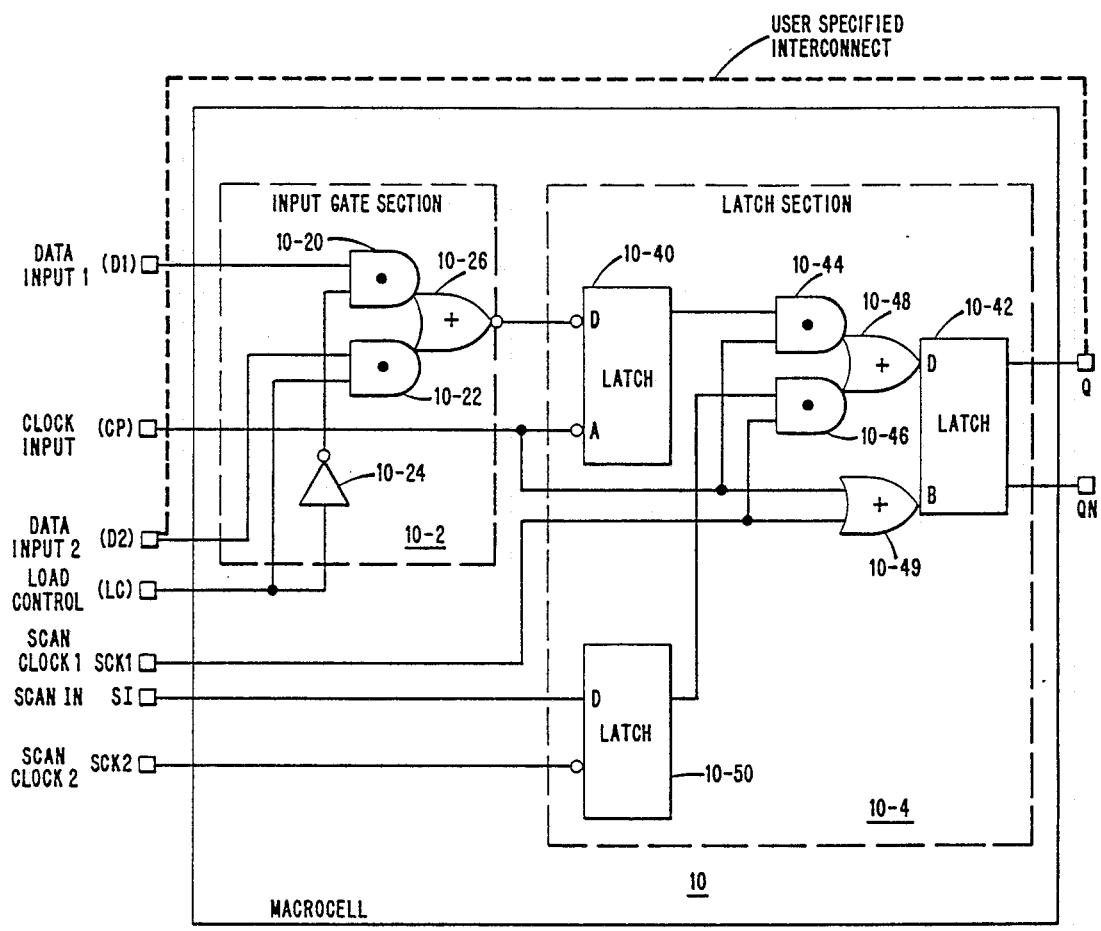
FIG. 1 is a block diagram of a preferred embodiment of the latch device of the present invention.

FIG. 1 shows in logic diagram form, a latch device constructed according to the principles of the present invention. As seen from FIG. 1, the device 10 includes an input gate section 10-2 and a latch section 10-4. The input gate section 10-2 is constructed from an inverting multiplexer which includes a pair of input AND gates 10-20 and 10-22, an inverter circuit 10-24 and an output NOR gate 20-26 which are connected as shown. The multiplexer may take the form of the standard inverting multiplexer macrocell part designated as MUX21L manufactured by LSI logic Corporation.

As shown in FIG. 1, the input gate section 10-2 connects directly to latch section 10-4. More specifically, the output of NOR gate 20-26 connects to the data input (D) of latch section 10-4. The latch section 10-4 includes a pair of series connected latches 10-40 and 10-42 and associated input AND gates and OR gates 10-44 through 10-48 which are connected to form a synchronous D type flip-flop. The bubble symbol at the input to latch 10-40 is included to indicate that the latch device provides a non-inverting path for data input signals (i.e., there is no inversion of the data input signals relative to the state of the latch section 10-4 output Q). Latch section 10-4 further includes an input scan latch 10-50 whose output connects to the data input of output latch 10-42 through AND gate 10-46 and OR gate 10-48. Portions of latch section 10-4 may take the form of the standard D flip-flop macrocell designated as FDIS2 manufactured by LSI Logic Corporation.

As shown in FIG. 1, input gate section 10-2 connects to a pair of complementary controlled data input pins, D1 and D2, either of which connect to a data source or to an output pin Q of latch section 10-4. As discussed herein, the connection between the Q output pin and one of the data input pins D1 or D2 is externally made through user specified interconnect or etch. According to the present invention, external connection to one of the data input pins D1 or D2 is made as a function of which connection provides faster operation (i.e., positive or negative logic). That is, as explained herein, the connection made is selected which corresponds to which one of the AND gates 10-20 or 10-22 responds earlier in time as VieWed from the input during source, such as the logic circuit which is to be connected to the latch device.

The load control signal which is generated as a function of one of a number of qualifier signals, Q60 or Q120, as discussed herein, is applied as the input to a load control input pin, LC. A chip clock signal is applied to a clock input pin CP and for switching the state of the latch device to the state of the data signal applied to its D input pin.

The latch section 10-4 connects to a scan input pin, SI and scan clock pins SCKI and SCK2 as shown. These inputs are used during system scan mode operations in which the data output received from a previous latch device is to be shifted through latch device 10 in a well known manner under the control of clocking signals applied to clock pins SCKI and SCK2. The use of two scan clock pins guards against race conditions.

DESCRIPTION OF FIG. 2

Figure 2:
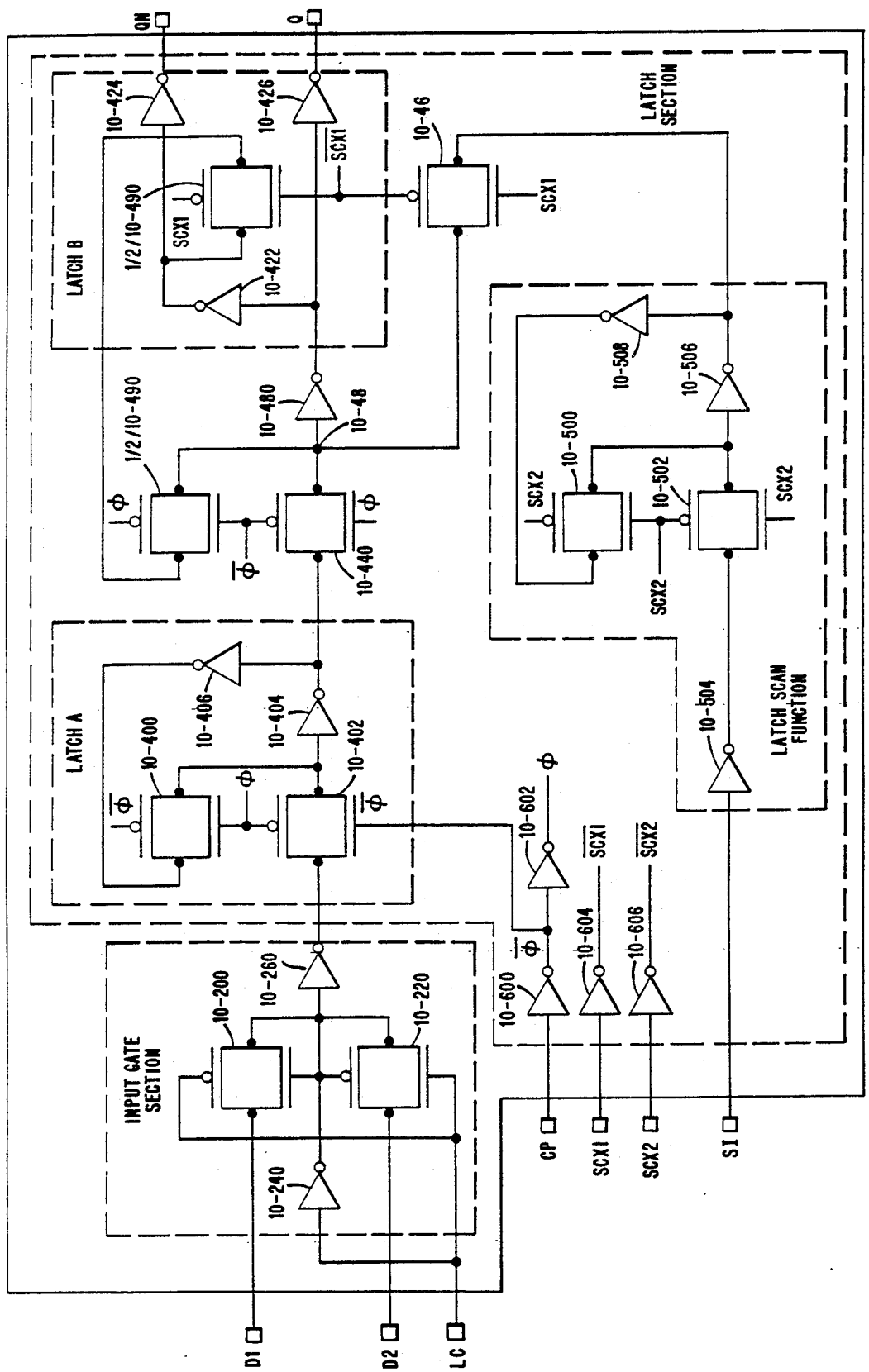
FIG. 2 is a circuit diagram of the latch device of FIG. 1.

FIG. 2 indicates the specific transistor circuits used to construct latch device 10. It will be seen that the gates 10-20 and 10-22 consist of pairs of CMOS transistors 10-200 and 10-220 whose outputs are wired ORed together at node 10-250 and two inverters 10-240 and 10-260. the node 10-250 and inverter 10-260 are represented in FIG. 1 by NOR gate 10-26. The output of inverter 10-260 directly connects to the gates of transistor pair 10-402 as shown. The integration of the gating requirements into the latch device 10 eliminates the need for inverting buffer circuits thereby minimizing space requirements and increasing speed by reducing signal propagation delays. This makes it possible to utilize an inverter multiplexer macrocell which requires less area than a non-inverter multiplexer macrocell.

Latch 10-40 consists of the pairs of CMOS transistors 10-400 and 10-402 and inverters 10-404 and 10-406 connected as shown. The gates 10-44 and 10-46 consist of the pairs of CMOS transistors 10-440 and 10-460. The outputs of these transistors are wired ORed at node 10-48 together represented in FIG. 1 by 0R gate 10-480 and applied to inverter 10-480. The latch 10-42 consists of CMOS transistor 10-420 and inverters 10-422 through 10-426 connected as shown. The OR gate 10-49 consists of CMOS transistors 10-490.

The scan latch 10-50 consists of the CMOS transistor pairs 10-500 and 10-502 and inverters 10-506 and 10-508 connected as shown. Additionally, latch device 10 includes inverters 10-600 through 10-606 which are used to generate clock signals $\phi$, $\phi$, SCX1 and SCX2 in response to signals CP, SCX1 and SCX2 applied to the corresponding input pins of device 10.

DESCRIPTION OF FIG. 3

Figure 3:
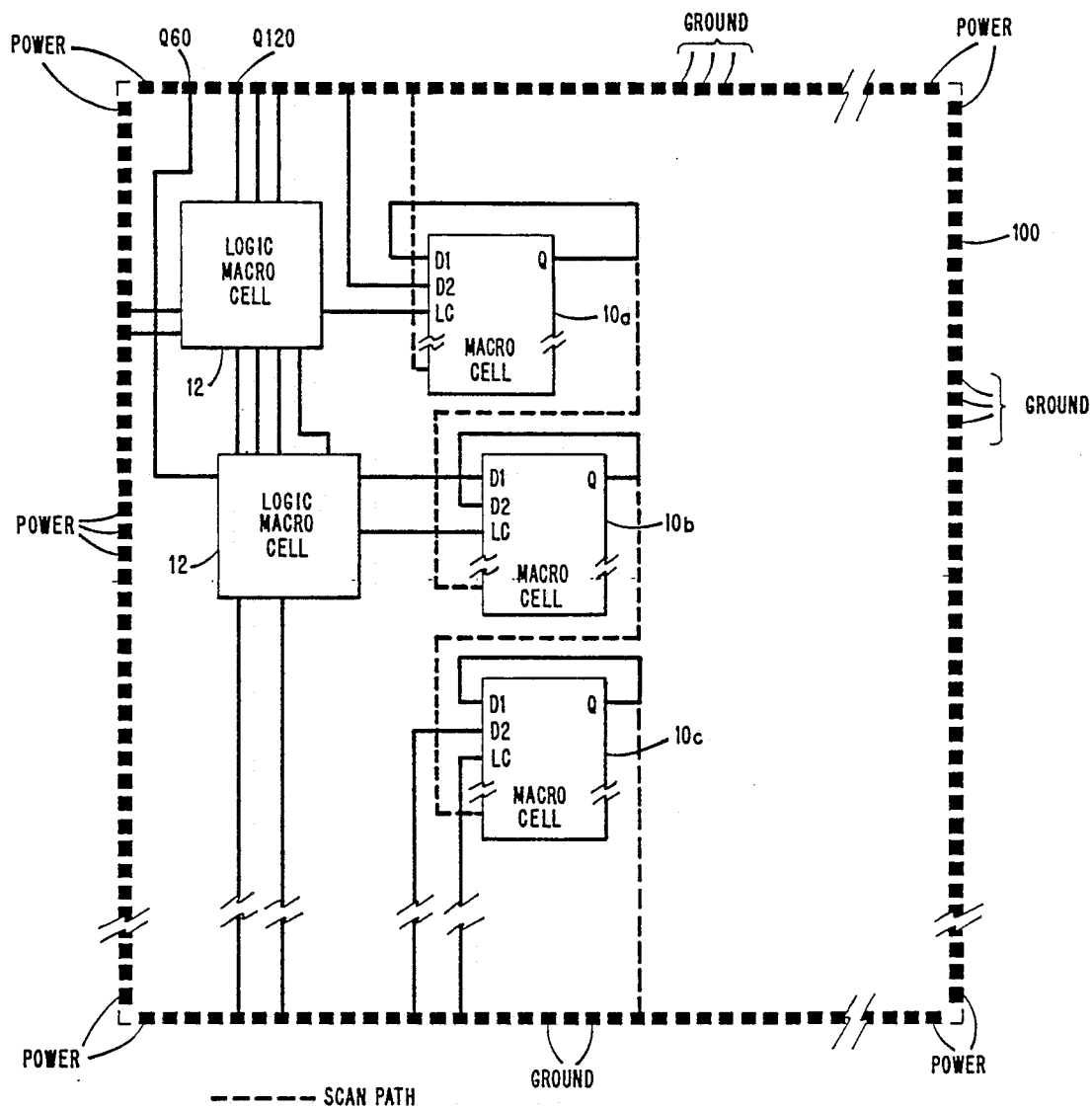
FIG. 3 is a diagram of the layout of a macrocell array which includes the latch device of the present invention.

The preferred embodiment of latch device 10 is included within a macrocell array, such as the array 100 of FIG. 3. The gate array takes the form of the LCA10129 gate array manufactured by LSI Logic Corporation. The gate array has a plurality of I/0 pads 120, the majority of which are used for logic signals and remaining used for power and ground.

As shown, a portion of array 100 includes three latch device macro cells 10a through 10c and a number of logic macrocells 12. The logic macro cells are elementary logic gates constructed with 2 to 50 CMOS transistors. The array can be viewed as a sea of transistors or gates that are interconnected with conductive wires. The latch device 10 utilizes a minimum number of transistors and hence is not much larger than the area occupied by a scannable standard D-type flip-flop macrocell.

Figure 4A:
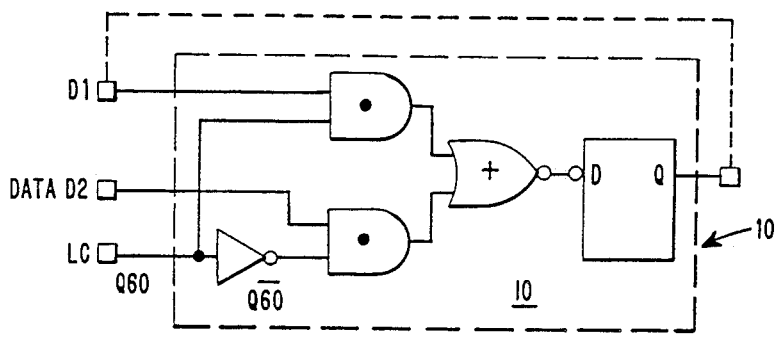
FIGS. 4a through 4h show different configurations of the latch device of FIG. 1.
Figure 4B:
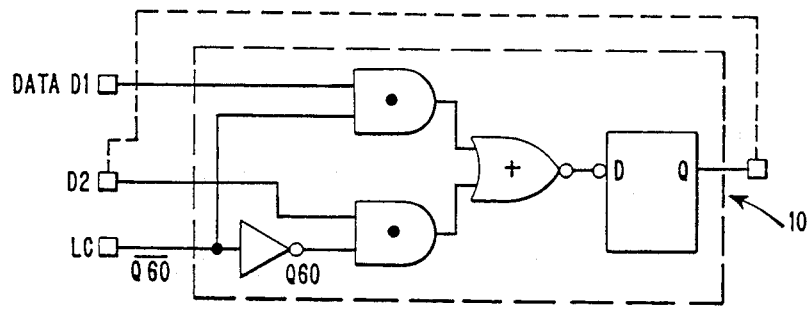
Figure 4C:
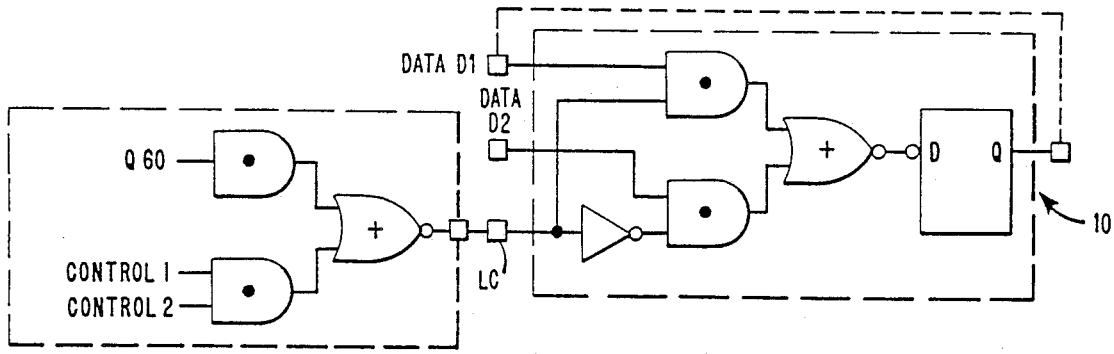
Figure 4D:
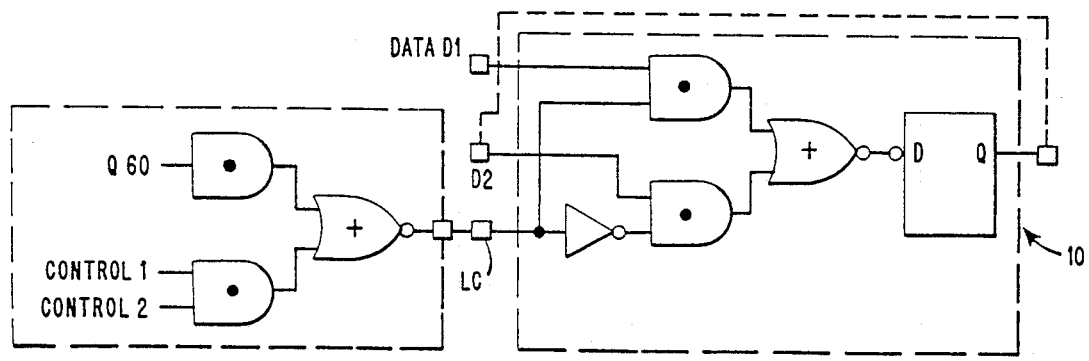

The macrocells 12 contain different control structures, portions of which correspond to those gating structures shown in FIGS. 4c and 4d. The control structures of cells 12 combine various sets of logic conditions corresponding to the logic signals applied to I/O pad or from other cells with one of two qualifier signals, Q60 and Q120 applied to I/0 pads to produce resulting control signals. The control signals are routed through a routing area corresponding to the space or area assigned between cell blocks for interconnections. Each control signal is then applied to the load control input pin LC of a different one of the latch devices 10a and 10b as shown in FIG. 3.

Additionally, according to the present invention, the output pin of latch device 10 of array 100 can be routed to connect to one of the input pins D1 and D2 which is selected so as to maximize speed as explained herein. In FIG. 3, it is assumed that the latch devices 10a, 10b and 10c are so connected. In certain instances, it may be only necessary to apply the qualifier signal Q60 or Q120 directly to the load control input pin LC of latch device 10, such as through an I/O pad as in the case of latch device 10c. Also, input pin LC can also be connected to a fixed logic level in the same manner. Additionally, each latch device 10 can be interconnected to other latch devices as shown by dotted lines in FIG. 3 to provide a scan capability.

DESCRIPTION OF FIGS. 4a THROUGH 4d

It will be obvious to those skilled in the art that there are a substantial number of different control structures which are constructed from the elementary logic gates contained within various macrocells. FIGS. 4a through 4d show several examples of control structures which may be used.

FIG. 4a shows an arrangement in which the qualifier signal Q60 connects to the LC pin of latch device 10, such as macrocell latch device 10c of FIG. 3. The latch or flip-flop 10 will maintain or hold its present state as long as signal Q60 remains active or high. Device 10 only changes state or is loaded with the new data applied to data input pin D1 when signal Q60 changes to an inactive or low state and upon the positive going edge of the clock signal applied to clock input pin CP. The operation is the same when qualifier signal Q120 is used in place signal Q60.

FIG. 4b shows an arrangement in which the qualifier signal Q60 connects to the LC pin of latch device 10. The latch device 10 will maintain or hold its present state as long as signal Q60 remains inactive or low. Again, device 10 is loaded with the data applied to pin D2 when signal Q60 switched to an active or high state and upon the positive going edge of the clock signal applied to pin CP.

FIG. 4c shows an arrangement in which qualifier signal Q60 is used in conjunction with several logic conditions represented by signals control 1 and control 2. This arrangement corresponds to macrocell latch device 10a of FIG. 3. The latch device 10 will maintain or hold its present state as long as signal Q60 or signals control 1 and control 2 are in an active or high state. As soon as signal Q60 and one of the signals control 1 and control 2 switches to an inactive or low state, device 10 is loaded with the new data applied to pin D2 when clocked.

FIG. 4d shows a similar logic structural arrangement with the difference that the signal Q60 and signals control 1 and 2 are applied to pin LC while the new data is applied to pin D1. This arrangement corresponds to the macrocell latch device 10c of FIG. 3. In this case, the latch device 10 will maintain or hold its present state as long as signal Q60 or signals control 1 and control 2 are in an active or high state. As soon as signal Q60 and both of the signals control 1 and 2 switches to an inactive or low state, the new data applied to pin D1 is loaded into the device when clocked.

From FIGS. 4c and 4d illustrate the important feature of the present invention of allowing for the use of either positive or negative logic which provides advantages in terms of space or speed. This is particularly important in macrocell array chip designs. The different macrocells have different propagation delay times for different input loadings when their inputs are driven from low to high (TPLH) and from high to low (TPLH). Thus, the interconnection of the output pin of each latch device 10 can be selected so as to be driven to its reset state by either negative or positive logic circuits according to which produces the shorter calculated propagation delay. For further information regarding the calculation of such delays, reference may be made to the publication entitled, "The HCMOS Compacted Array Products Databook" by LSI Logic Corporation, Copyright 1987.

Figure 4E:
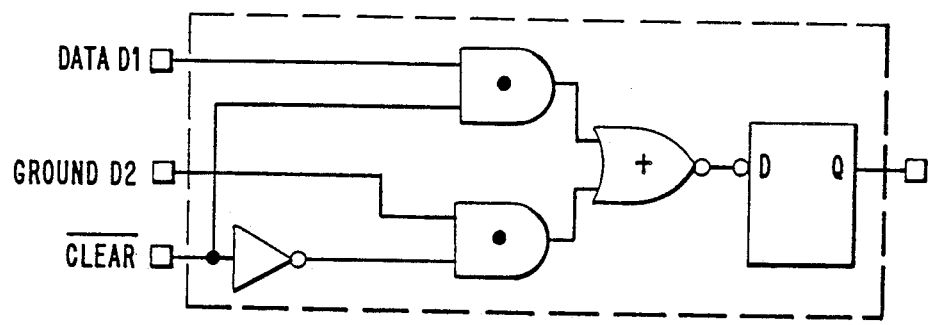
Figure 4F:
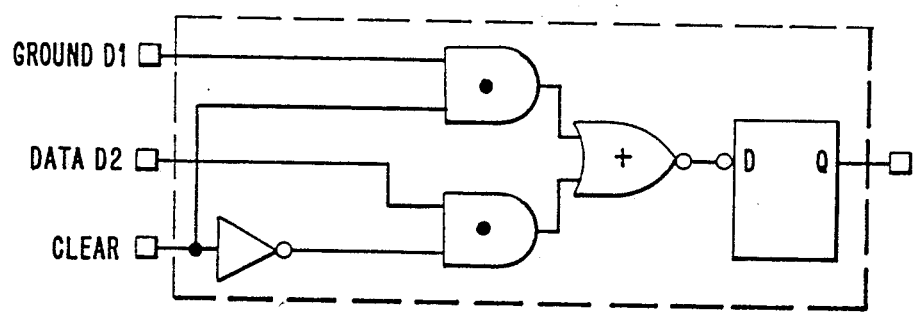
Figure 4G:
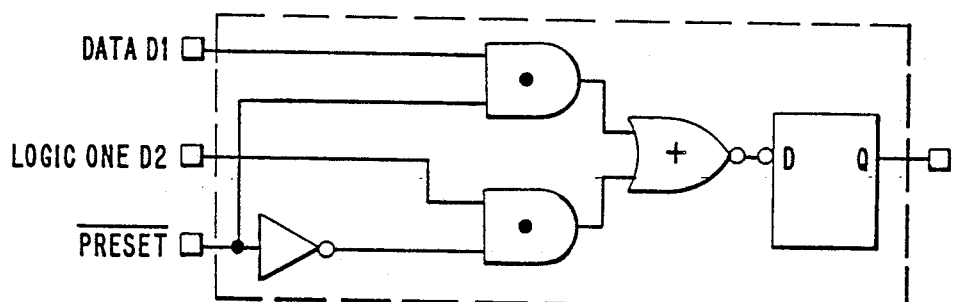
Figure 4H:
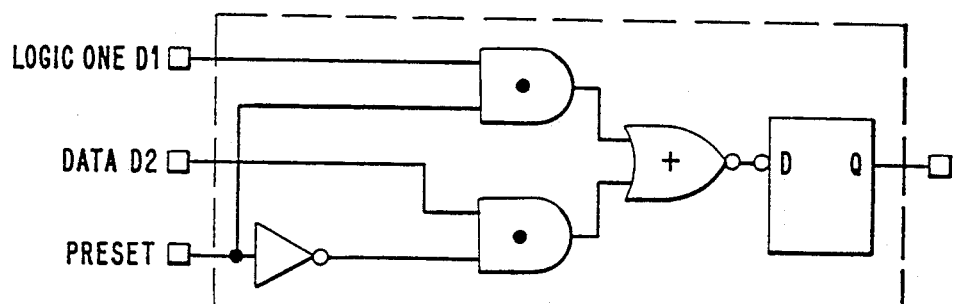

The remaining FIGS. show additional arrangements which allow the use of negative or positive logic selected as a function of speed. FIGS. 4e and 4f show how a synchronous clear function can be included in latch device 10 with a clear signal of either polarity by reversing the data and ground connections to pins D1 and D2 as shown. FIGS. 4g and 4h show how a preset function can be included in latch device 10 in a similar manner.

DESCRIPTION OF FIGS. 5a THROUGH 5d

Figure 5A:
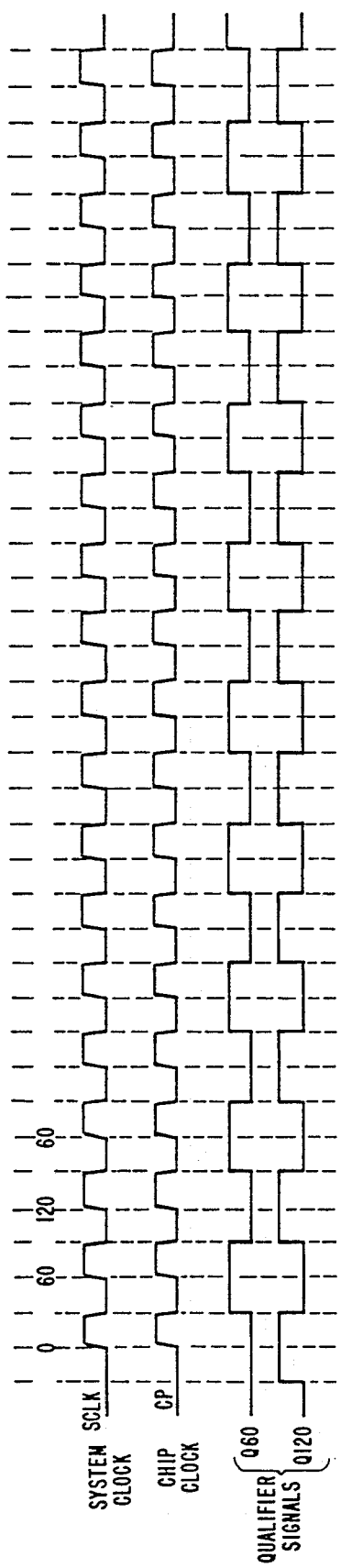
FIGS. 5a through 5d are timing diagrams used in explaining the operation of the latch device of the present invention.

FIGS. 5a through 5d show how the latch device 10 can be used to perform a variety of functions. FIG. 5a shows the basic timing of a processing unit in which device 10 is used for register storage. The system clock signal SCLK defines the basic timing for the processing unit and this signal coincides with the timing of chip clock signal CP which is applied to the pin CP of each latch device of the system. The qualifier signal Q60 defines the first half of the processing unit cycle while qualifier signal Q120 defines the second half of the same cycle.

With reference to FIG. 4a, it is seen that the latch device 10 changes state at time 120 while the latch device 10 of FIG. 4b changes state at time 60. By using qualifier signals Q60 and Q120, the system can evaluate logic conditions and load the results of these conditions at times defined by the qualifier signals Q60 and Q120 as shown. FIGS. 4c and 4d illustrate that these conditions can be expressed in terms of either negative or positive logic for selecting whichever is faster in terms of generating a load control signal applied to pin LC for loading latch device 10 with new data.

Figure 5B:
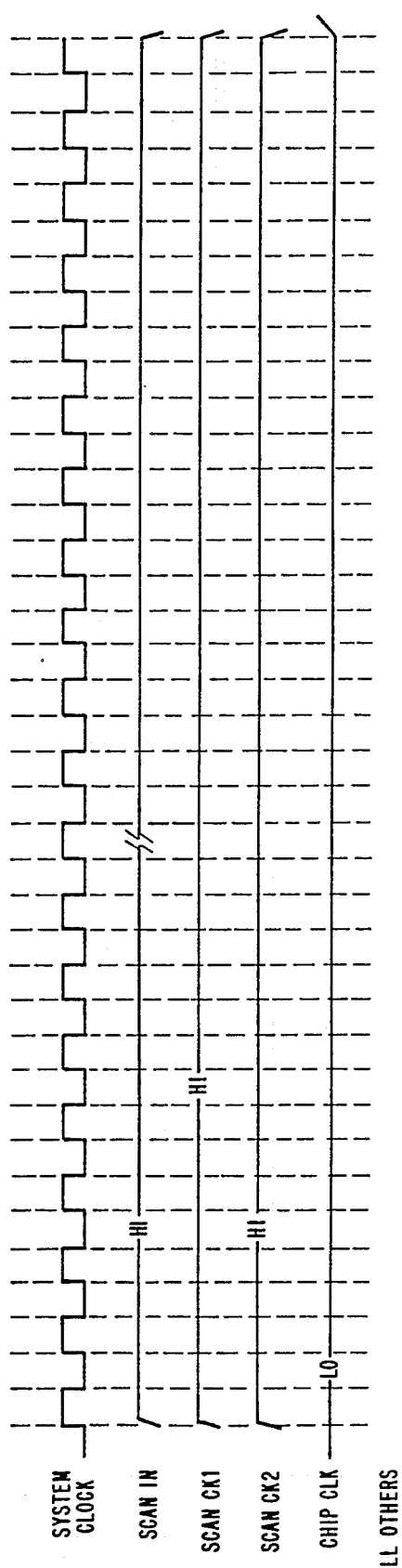
Figure 5C:
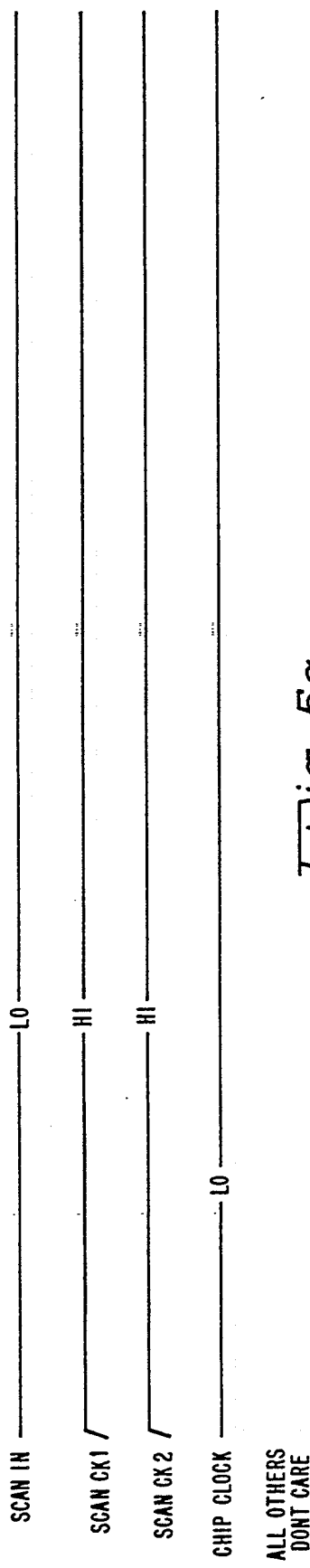
Figure 5D:
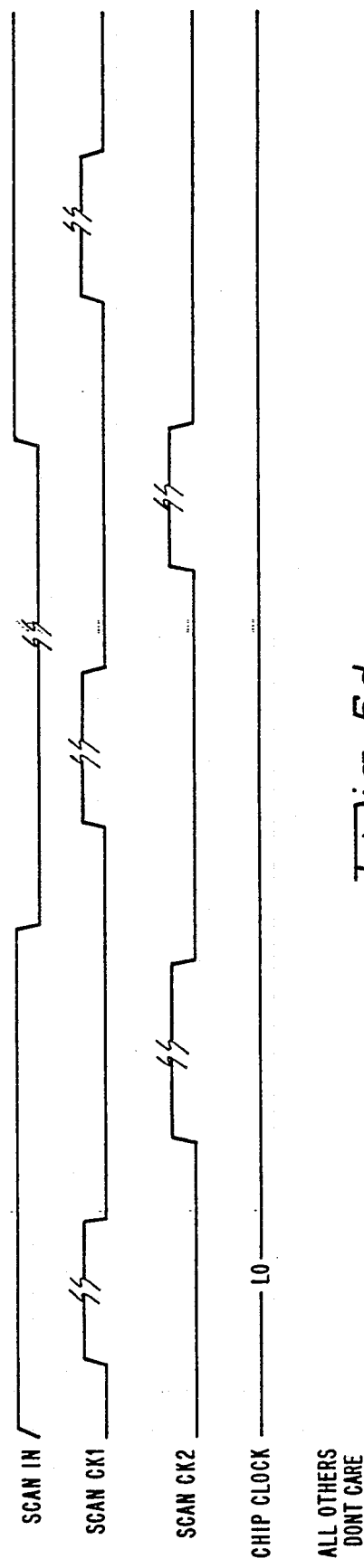

FIGS. 5b through 5d shows the timing and the state of the input signals applied to latch device 10 when the system is operated in a scan mode. FIG. 5b shows the states of the signals for setting all of the devices 10 within the scan path of the processing unit to an active or high state. A portion of the scan path is represented by the dotted lines interconnecting latch devices 10a, 10b and 10c in FIG. 3. Setting is accomplished by forcing the chip clock CP of each device 10 to an inactive state. This logically disconnects input gate section 10-2 of each latch device from the rest of the device 10. At the same time, the scan data pin SI of each device 10 is forced to an active or high state and this state is loaded into each of the devices 10 in response to the clocking signals applied to input pins SCK1 and SCK2. This mode of operation would normally take place as part of the power up test procedure.

FIG. 5c shows states of the input signals for clearing all of the devices 10 within the scan path to an inactive or low state. Again, the low state of clock signal CP logically disconnects section 10-2 of each device 10 while pin SI is forced to an inactive or low state which clears to ZEROS all of the devices 10 within the scan path. FIG. 5d shows the states of the input signals for loading a scan pattern of "101" into the scan path latch devices 10.

From the above, it is seen how the latch device of the present invention can be used to perform a variety of functions with a minimum of complexity in terms of the numbers of transistors and gates minimizing area and at very high speed. The latch device arrangement of the present invention, when used in conjunction with one or more qualifier signals, can be connected to numerous types of logic structures so as to enable the processing of logical conditions with a minimum of propagation delays. This becomes particularly important when the device is implemented in a gate array macrocell form.

Many changes may be made to the latch device of the present invention without departing from its teachings. For example, the latch device of the present invention is not limited to the construction or characteristics of a particular gate array macrocell arrangement or technology. For example, the latch device of the present invention may be used in MSI or LSI technology. Further, it can be used or controlled by any type of logic structure or directly controlled by means of fixed voltage signals. Other changes will be obvious to those skilled in the art.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A macrocell array comprising a number of macrocells including a synchronous D-type storage macrocell, said macrocell storage device having a plurality of input pins and at least one output pin for providing a non-inverting path for input data signals and a plurality of semiconductor devices, said plurality of semiconductor devices being interconnected within said cell to provide a latch device having series connected input gate and clocked scannable latch sections, said input gate section having a pair of data input pins and a load control pin and said latch section having a clock input pin and a data output pin and said array further including a routing area external to said latch device, said routing area providing conductors for interconnecting pins of said latch device to pins of other ones of said number of different macrocells as required for carrying out a specified operation, said area including:

a first conductor wire for selectively interconnecting one of said pair of data input pins of said latch device to a data source for applying new data which is to be loaded into said latch device;

a second conductor wire for selectively interconnecting another one of said pair of data input pins to said output pin for holding said latch device in a present state independently of signals applied to other ones of said input pins, said selection of one of said pair of data input pins for connection to said output pin being made as a function of which interconnection provides faster loading of said latch device with new data relative to application of said load control signal in response to a clock input signal being applied to said clock input pin for transferring a representation of the state of said new data to said output pin; and, a third conductor wire for interconnecting said load control input pin to a control source for applying a load control signal defining when said latch device is to be loaded with said new data in lieu of being held in said present state.

2. The macrocell array of claim 1 wherein a first group of said number of different macrocells, each include a number of inputs and outputs and a plurality of semiconductor devices interconnected within each cell to provide a logic structure for performing a specific logic function on data signals applied to said number of inputs, said data signals including a number of qualifier signals, the result of certain logical conditions represented by other ones of said data signals to be evaluated and stored, and wherein said load control input pin connects to an output of a macrocell of said first group of macrocells as said control source.

3. The macrocell array of claim 2 wherein said output of said macrocell causes said latch device to be held in said present state when said qualifier signal is in an active state and said latch device is enabled to be loaded with new data corresponding to the result of combining said logic conditions when said qualifier signal is in an inactive state.

4. The macrocell array of claim 3 wherein said active state corresponds to either a high or low signal level depending upon which connection provides a faster generation of said load control signal for loading said latch device.

5. The macrocell array of claim 1 wherein said plurality of semiconductor devices include a minimum number of CMOS transistors which cover an area which is slightly larger than the area of a standard D-type flip-flop.

6. The macrocell array of claim 1 wherein said latch section of said latch device includes input and output latches, each being connected to said clock input pin, said input data latch directly connected to said gate section and said output data latch connected in series with said input data latch and to said output pin for loading said new data loaded into said first latch into said output data latch in response to said clock input signal being applied to said clock input pin.

7. The macrocell array of claim 6 wherein said scannable latch section of said latch device further includes a scan data latch connected to said output data latch, said scan data latch having a scan data input pin and at least one scan clock input pin, said output data latch of said latch device in the absence of any clock input signal applied to said clock input pin being loaded with data signals applied to said scan data input pin in response to a scan clock signal applied to said scan clock input pin for enabling shifting of data through said latch device during a test mode of operation.

8. The macrocell of claim 1 wherein said gate section has a pair of two input AND gates whose outputs are ORed together and applied to an output inverter circuit, each of said pair of AND gates having one input connected to a different one of said data input pins and another input connected to said load control pin directly or indirectly through an inverter circuit so that a different one of said pair of AND gates will be enabled by active and inactive states of said load control signal.

9. The macrocell of claim 1 wherein said array further includes a plurality of input/output pads including pads for power and ground reference voltages, said third conductor wire interconnecting said load control input pin to one of said input/output pads as said control source for applying said load control signal, said gate section being conditioned by said load control signal when in an active state to hold said latch device in said present state and said latch device being enabled to be loaded with new data when said load control signal switches to an inactive state.

10. The macrocell of claim 9 wherein said active and inactive states correspond to high and low voltage levels respectively and said load control pin is connected to a power voltage reference input/output pin.

11. The macrocell of claim 9 wherein said active and inactive states of said load control signal correspond to low and high voltage levels respectively and said load control pin is connected to a ground reference voltage input/output pin.

12. A synchronous D-type latch device connected as a single cell included in an integrated circuit chip for registering signal representations of an input data signal generated within said chip, said input data signal having at least two states, said device having a plurality of input pins and at least one output pin for providing a non-inverting path for said input data signal and a number of transistor circuits interconnected to form series connected input gate and a scannable latch section in a manner which minimizes circuit delay, said input gate section having only a pair of data input pins and a load control pin for selecting between said pair of pins as a source of data to said clocked latch section;

said latch section having a clock input pin and a data output pin, and conductor means external to said device used for interconnecting said input and output pins to other circuits on said chips, said conductor means including:

a first conductor wire for selectively interconnecting one of said pair of data input pins of said latch device to a data source for applying new data which is to be loaded into said latch device;

a second conductor wire for selectively interconnecting another one of said pair of data input pins to said output pin for holding said latch device in a present state independently of signals applied to other ones of said input pins, said selection of one of said pair of data input pins for connection to said output pin being made as a function of which interconnection provides faster loading of said latch device with new data relative to application of said load control signal in response to a clock input signal being applied to said clock input pin which transfers a representation of the state of said new data in a non-inverting manner to said output pin; and, a third conductor for interconnecting said load control input pin to a control source for applying a load control signal defining when said latch device is to be loaded with said new data in lieu of being held in said present state.

13. The latch device of claim 12 wherein said chip includes a number of logic circuit structures, each including a number of inputs and outputs and a plurality of semiconductor devices interconnected within each structure to perform a specific logic operation on data signals applied to said number of inputs, said data signals including a number of qualifier signals and other ones of said data signals representing the result of certain logical conditions to be evaluated and stored, and wherein said load control input pin connects to an output of said number of structures as said control source.

14. The latch device of claim 12 wherein said output of said structure causes said latch device to be held in said present state when said qualifier signal is in an active state and said latch device is enabled to be loaded with new data corresponding to the result of combining said logic conditions when said qualifier signal is in an inactive state.

15. The latch device of claim 14 wherein said active state corresponds to either a high or low signal level depending upon which connection provides a faster generation of said load control signal for loading said latch device with said new data.

16. The latch device of claim 13 wherein said plurality of semiconductor devices include a minimum number of CMOS transistors which cover an area which is slightly larger than the area of a standard D-type flip-flop.

17. The latch device of claim 13 wherein said latch section of said latch device includes input and output latches, each latch being connected to said clock input pin, said input data latch being directly connected to said gate section and said output data latch connected in series with said input data latch and to said output pin for loading said new data loaded into said first latch into said output data latch in response to said clock input signal being applied to said clock input pin.

18. The latch device of claim 17 wherein said latch section of said latch device further includes a scan data latch connected to said output data latch, said scan data latch having a scan data input pin and at least one scan clock input pin, said output data latch of said latch device in the absence of any clock input signal applied to said clock input pin being loaded with data signals applied to said scan data input pin in response to a scan clock signal applied to said scan clock input pin for enabling shifting of data through said latch device during a test mode of operation.

19. The latch device of claim 13 wherein said gate section has a pair of two input AND gates whose outputs are ORed together and applied to an output inverter circuit, each of said pair of AND gates having one input connected to a different one of said data input pins and another input connected to said load control pin directly or indirectly through an inverter circuit so that a different one of said pair of AND gates will be enabled by active and inactive states of said load control signal.

20. The latch device of claim 19 wherein said active and inactive states correspond to high and low voltage levels respectively and said load control pin is connected to a voltage reference signal.

21. The latch device of claim 20 wherein said active and inactive states of said load control signal correspond to low and high voltage levels respectively and said load control pin is connected to a ground reference voltage.

22. The latch device of claim 12 wherein one of said data input pins is connected to a reference voltage representative of a predetermined state and another one of said data input pins is connected to receive new data in lieu of being connected to said output pin, said load control signal when in an active state causing said latch device to assume said predetermined state.

23. The latch device of claim 22 wherein said predetermined voltage is a ground reference voltage corresponding to a binary ZERO and said load control signal clears said latch device to a binary ZERO state.

24. The latch device of claim 23 wherein said predetermined voltage is a voltage corresponding to a binary ONE state, and said load control signal presets said latch device to a binary ONE state.

25. A macrocell array comprising:
a plurality of macrocells including:
a first number of said macrocells having a number of input and output pins and a plurality of semiconductor devices, said semiconductor devices being interconnected within each cell to provide a combinational logic function whose result is to be applied to one of said output pins and
a second number of said macrocells having a number of pins and a plurality of semiconductor devices, said plurality of semiconductor devices being interconnected within each cell to provide a latch device for providing a fast non-inverting data path for input data signals, said latch device having series connected input gate and clocked scannable latch sections, said input gate section having a pair of complementary controlled data input pins and a load control input pin for selecting between said pair of data input pins and said latch section having at least one clock input pin and a data output pin;
a plurality of input/output pads for receiving input logic signals including one or more control qualifier signals for evaluating logic conditions; and
a routing area, said area including a first number of conductor wires for interconnecting selected ones of said input/output pads to pins of each of said first number of macrocells for combining input logic signals representative of certain conditions to be evaluated and stored with different qualifier signals as required to produce a desired result, conductor wires for selectively connecting a first one of said pair of data input pins of each of said second number of macrocells to either one of said input/output pads or one of said number of pins of one of said first number of macrocells for applying new data to be loaded therein;
a second number of conductor wires for selectively interconnecting said output pin of each of said second number of macrocells to a second one of said pair of data input pins for holding each said latch device in a given state and a third number of conductor wires for interconnecting said load control input pin to either one of said input/output pads or one of said number of pins of one of said first number of macrocells for receiving a load control signal for loading each said latch device with said new data, said selection of one of said first and second data input pins for connection to said output pin of each of said second number of macrocells being made as a function of which connection provides faster loading of a corresponding one of said latch devices with said new data relative to the propagation of said load control signals in response to a clock input signal being applied to said clock input pins of the latch devices.

26. The macrocell array of claim 25 wherein said load control signal of each macrocell causes a corresponding latch device to be held in said present state when said qualifier signal is in an active state and said latch device is enabled to be loaded with new data corresponding to the result of combining said logic conditions when said qualifier signal is in an inactive state.

27. The macrocell array of claim 26 wherein said active state corresponds to either a high or low signal level depending upon which connection provides a faster generation of said load control signal for loading said latch device.

28. The macrocell array of claim 25 wherein said latch section of said latch device includes input and output latches, each latch being connected to said clock input pin, said input data latch directly connected to said gate section and said output data latch connected in series with said input data latch and to said output pin for loading said new data loaded into said first latch into said output data latch in response to said clock input signal being applied to said clock input pin.

29. The macrocell array of claim 28 wherein said latch section of said latch device further includes a scan data latch connected to said output data latch, said scan data latch having a scan data input pin and at least one scan clock input pin, said output data latch of said latch device in the absence of any clock input signed applied to said clock input pin being loaded with data signals applied to said scan data input pin in response to a scan clock signal applied to said scan clock input pin for enabling shifting of data through said latch device during a test mode of operation.

30. The macrocell of claim 25 wherein said gate section is constructed from a standard inverting multiplexer macrocell and said latch section is constructed from a portion of a standard scannable D-type flip-flop macrocell.

31. The macrocell of claim 30 wherein said standard multiplexer macrocell has a pair of two input AND gates whose outputs are ORed together and applied to an output inverter circuit, each of said pair of AND gates having one input connected to a different one of said data input pins and another input connected to said load control pin directly and indirectly through an inverter circuit so that a different one of said pair of AND gates are controllable by complementary active and inactive states of said load control signal.

* * * * *